US011262416B2

(12) United States Patent
Tsutsumi et al.

(10) Patent No.: US 11,262,416 B2
(45) Date of Patent: Mar. 1, 2022

(54) DIAGNOSTIC CIRCUIT, ELECTRONIC CIRCUIT, ELECTRONIC DEVICE, AND MOBILE BODY

(71) Applicants: Seiko Epson Corporation, Tokyo (JP); DENSO CORPORATION, Kariya (JP)

(72) Inventors: Akio Tsutsumi, Chino (JP); Naoki Yoshida, Kariya (JP)

(73) Assignees: SEIKO EPSON CORPORATION; DENSO CORPORATION

(*) Notice: Subject to any disclaimer, the term of this patent is extended or adjusted under 35 U.S.C. 154(b) by 804 days.

(21) Appl. No.: 15/776,147

(22) PCT Filed: Nov. 9, 2016

(86) PCT No.: PCT/JP2016/083209
§ 371 (c)(1),
(2) Date: May 15, 2018

(87) PCT Pub. No.: WO2017/086219
PCT Pub. Date: May 26, 2017

(65) Prior Publication Data
US 2020/0256928 A1 Aug. 13, 2020

(30) Foreign Application Priority Data
Nov. 19, 2015 (JP) .............................. JP2015-226519

(51) Int. Cl.
*G01R 31/64* (2020.01)
(52) U.S. Cl.
CPC .................................. *G01R 31/64* (2020.01)

(58) Field of Classification Search
CPC ................................ G01R 31/64; G01R 31/50
See application file for complete search history.

(56) References Cited

U.S. PATENT DOCUMENTS

| 5,521,488 A | * | 5/1996 | Stockstad | H02M 3/1563 323/223 |
| 10,602,578 B1 | * | 3/2020 | Neri | H05B 45/355 |
| 2002/0171467 A1 | * | 11/2002 | Worley, Sr. | H05B 45/37 327/514 |
| 2004/0075422 A1 | * | 4/2004 | Del Gatto | G05F 3/262 323/282 |

(Continued)

FOREIGN PATENT DOCUMENTS

| JP | 06-053981 U | 7/1994 |
| JP | 07-27801 A | 1/1995 |
| JP | 2014-225247 A | 12/2014 |

*Primary Examiner* — Rexford N Barnie
*Assistant Examiner* — Brian K Baxter
(74) *Attorney, Agent, or Firm* — Harness, Dickey & Pierce, P.L.C.

(57) ABSTRACT

A diagnostic circuit is provided that diagnoses a connection state of a capacitor connected to an output terminal of a regulator that outputs a first voltage, the diagnostic circuit including: a switching circuit that performs, during a first period, a switching control process of switching an output voltage of the regulator to a second voltage that is higher than the first voltage; a detecting circuit that detects a variation in an output current of the regulator caused by the switching control process; and a determining circuit that determines the connection state of the capacitor, based on a detection result of the detecting circuit.

11 Claims, 10 Drawing Sheets

(56) References Cited

U.S. PATENT DOCUMENTS

| | | | | |
|---|---|---|---|---|
| 2005/0157522 | A1* | 7/2005 | Osaka | H02M 3/33569 363/21.02 |
| 2006/0208789 | A1* | 9/2006 | Shimada | H02M 3/158 327/540 |
| 2007/0188155 | A1* | 8/2007 | Oki | H02M 1/32 323/280 |
| 2007/0289855 | A1* | 12/2007 | Schumacher | B60R 21/017 200/237 |
| 2009/0128116 | A1* | 5/2009 | Noda | H02M 3/1588 323/290 |
| 2010/0079127 | A1* | 4/2010 | Grant | H05B 45/37 323/285 |
| 2010/0327831 | A1* | 12/2010 | Nishida | H02P 8/12 323/282 |
| 2011/0316515 | A1* | 12/2011 | Mitsuda | H03L 1/04 323/314 |
| 2012/0008346 | A1* | 1/2012 | Kawamura | H02M 3/33523 363/21.15 |
| 2012/0306586 | A1* | 12/2012 | Wan | H02M 3/156 332/109 |
| 2013/0335047 | A1* | 12/2013 | Yamaguchi | H02M 3/156 323/282 |
| 2014/0197813 | A1* | 7/2014 | Umetani | H02M 3/156 323/282 |
| 2014/0253076 | A1* | 9/2014 | Utsunomiya | H02M 3/158 323/282 |
| 2014/0312872 | A1* | 10/2014 | Sato | G05F 1/565 323/303 |
| 2015/0035510 | A1* | 2/2015 | Hoshino | H02M 3/157 323/283 |
| 2015/0061621 | A1* | 3/2015 | Pons | G05F 1/56 323/280 |
| 2015/0180326 | A1* | 6/2015 | Motojima | G05F 1/575 323/282 |
| 2015/0333611 | A1* | 11/2015 | Lakkimsetti | H02M 3/156 323/271 |

* cited by examiner

DIAGNOSTIC CIRCUIT, ELECTRONIC CIRCUIT, ELECTRONIC DEVICE, AND MOBILE BODY

CROSS-REFERENCE TO RELATED APPLICATIONS

This application is a U.S. National Stage of International Application No. PCT/JP2016/083209, filed on Nov. 9, 2016, published in Japanese as WO 2017/086219 A1 on May 26, 2017, which claims priority to Japanese Patent Application No. 2015-226519, filed on Nov. 19, 2015. The entire disclosures of the above applications are incorporated herein by reference.

BACKGROUND

Technical Field

The invention relates to a diagnostic circuit, an electronic circuit, an electronic device, and a mobile body.

Background Art

Configurations in which an external capacitor is connected to an output terminal of a regulator are widely known. In applications where high reliability is required, there is a need for a capability of diagnosing whether or not the external capacitor is correctly connected.

JP-UM-A-6-53981 discloses a diagnostic circuit which diagnoses a capacitance value of an external capacitor when power is turned on. JP-A-7-27801 discloses a diagnostic circuit which diagnoses a capacitance value of an external capacitor based on a charge time of the external capacitor. With the configurations according to JP-UM-A-6-53981 and JP-A-7-27801, performing a diagnosis requires that a charge of an external capacitor be sufficiently discharged and the external capacitor be subsequently recharged. Therefore, after power is turned on, it is difficult to diagnose an external capacitor connected to an output terminal of a regulator without interrupting supply of power to a circuit that operates based on an output voltage of the regulator.

The invention has been made in consideration of problems such as that described above and, according to some aspects of the invention, a diagnostic circuit, an electronic circuit, an electronic device, and a mobile body can be provided which enable diagnosis of a connection state of a capacitor during an operation of a circuit that receives power supplied from a regulator.

SUMMARY

The invention has been made in order to solve at least a part of the problems described above and can be implemented as aspects or application examples presented below.

APPLICATION EXAMPLE 1

According to one application example, there is provided a diagnostic circuit diagnosing a connection state of a capacitor connected to an output terminal of a regulator that outputs a first voltage, the diagnostic circuit including:

a switching circuit which performs, during a first period, a switching control process of switching an output voltage of the regulator to a second voltage that is higher than the first voltage;

a detecting circuit that detects a variation in an output current of the regulator caused by the switching control process; and a determining circuit that determines the connection state of the capacitor, based on a detection result of the detecting circuit.

The connection state refers to a state indicating, for example, whether or not the capacitor is connected or a magnitude of a capacitance value.

According to the above application example, since a connection state of a capacitor can be diagnosed by switching the output voltage of the regulator to the second voltage that is higher than the first voltage in the first period, a diagnostic circuit which enables diagnosis of a connection state of a capacitor during an operation of a circuit that receives supply of power from the regulator can be realized.

APPLICATION EXAMPLE 2

The diagnostic circuit described above may further include a switching signal generating circuit, and the switching circuit may switch the output voltage of the regulator to the second voltage based on a pulse signal from the switching signal generating circuit.

According to the above application example, the switching control process can be performed with a simple configuration.

APPLICATION EXAMPLE 3

In the diagnostic circuit described above, the detecting circuit may include an internal capacitor; and a current mirror circuit that outputs a mirror current of the output current of the regulator to one end of the internal capacitor, and the determining circuit may include a comparator that detects a variation in the output current by comparing a voltage at the one end of the internal capacitor with a reference voltage.

According to the above application example, the output current of the regulator can be detected with a simple configuration. In addition, a diagnosis of the connection state of the capacitor can be performed with a simple configuration.

APPLICATION EXAMPLE 4

According to one application example, there is provided an electronic circuit including:

the diagnostic circuit described above;

a circuit block to which power is supplied from the regulator; and a control circuit that sets a part of the circuit block to a non-operating state during the first period.

According to the above application example, an electronic circuit can be realized which enables output with high reliability in the first period by, for example, changing a part of a circuit block in which high accuracy with respect to a power-supply voltage is required to a non-operating state.

APPLICATION EXAMPLE 5

According to one application example, there is provided a diagnostic circuit diagnosing connection states of a first capacitor connected to an output terminal of a first regulator and a second capacitor connected to an output terminal of a second regulator, the diagnostic circuit including:

a first switching circuit that switches, during a first period, an output voltage of the first regulator that outputs a first voltage to a second voltage that is higher than the first voltage;

a first internal capacitor;

a first current mirror circuit that outputs a mirror current of an output current of the first regulator to one end of the first internal capacitor;

a second switching circuit that switches, during the first period, an output voltage of the second regulator that outputs a third voltage to a fourth voltage that is higher than the third voltage;

a second internal capacitor;

a second current mirror circuit that outputs a mirror current of an output current of the second regulator to one end of the second internal capacitor; and a determining circuit that determines connection states of the first capacitor and the second capacitor, the determining circuit including:

a first comparator that compares a voltage at the one end of the first internal capacitor with a first reference voltage;

a second comparator that compares a voltage at the one end of the second internal capacitor with a second reference voltage; and a determining unit that determines the connection states of the first capacitor and the second capacitor based on a time required by the voltage at the one end of the first internal capacitor to exceed the first reference voltage and a time required by the voltage at the one end of the second internal capacitor to exceed the second reference voltage.

According to the above application example, since connection states of the first capacitor and the second capacitor can be diagnosed by switching the output voltage of the first regulator to the second voltage that is higher than the first voltage and switching the output voltage of the second regulator to the fourth voltage that is higher than the third voltage in the first period, a diagnostic circuit which enables diagnosis of connection states of the first capacitor and the second capacitor during an operation of a circuit that receives supply of power from the first regulator and the second regulator can be realized.

In addition, a diagnostic circuit which enables diagnosis of relative sizes of the capacitance value of the first capacitor and the capacitance value of the second capacitor by comparing a charge time of the first capacitor and a charge time of the second capacitor with each other can be realized.

In particular, highly accurate diagnosis can be readily realized when a current output capacity of the first regulator is equal to a current output capacity of the second regulator, a voltage difference between the first voltage and the second voltage is equal to a voltage difference between the third voltage and the fourth voltage, and a capacitance value of the first capacitor is equal to a capacitance value of the second capacitor.

APPLICATION EXAMPLE 6

According to one application example, there is provided an electronic circuit including:

any of the diagnostic circuits described above; and a register, the diagnostic circuit writing error information into the register when the determining circuit determines that the connection state of the capacitor is anomalous.

According to the above application example, error information can be readily utilized by another circuit block or apparatus.

APPLICATION EXAMPLE 7

According to one application example, there is provided an electronic circuit including any of the diagnostic circuits described above, the determining circuit outputting an error information signal to the outside when determining that the connection state of the capacitor is anomalous.

According to the above application example, error information can be readily utilized by another circuit block or apparatus.

APPLICATION EXAMPLE 8

According to one application example, there is provided an electronic circuit including:

any of the diagnostic circuits described above; and a reset circuit that outputs a reset signal of the electronic circuit when the determining circuit determines that the connection state is anomalous.

According to the above application example, by initializing the electronic circuit based on a reset signal output when an anomaly occurs, an appropriate circuit operation can be prompted.

APPLICATION EXAMPLE 9

According to one application example, there is provided an electronic circuit including:

any of the diagnostic circuits described above; and a reset circuit that changes a potential difference between the first voltage and the second voltage and outputs a reset signal of the electronic circuit when the determining circuit determines that the connection state is anomalous.

According to the above application example, by initializing the electronic circuit under conditions that differ from previous conditions based on a reset signal output when an anomaly occurs, an appropriate circuit operation can be prompted.

APPLICATION EXAMPLE 10

According to one application example, there is provided an electronic device including any of the diagnostic circuits described above.

According to the above application example, since a diagnostic circuit which enables diagnosis of a connection state of a capacitor during an operation of a circuit that receives supply of power from a regulator is provided, an electronic device capable of operating in a stable manner can be realized.

APPLICATION EXAMPLE 11

According to one application example, there is provided an electronic device including:

any of the diagnostic circuits described above;

a sensor that outputs a sensor signal in accordance with a size of a physical quantity; and a processing circuit, the processing circuit performing:

a noise amount calculating process of calculating a noise amount included in the sensor signal; and a determining process of determining that the noise amount is larger than a threshold.

According to the above application example, since a diagnostic circuit which enables diagnosis of a connection state of a capacitor during an operation of a circuit that receives supply of power from a regulator is provided, an electronic device capable of operating in a stable manner can be realized.

In addition, since a determination that a noise amount included in a sensor signal is larger than a threshold is made, an electronic device capable of operating with high reliability even when the noise amount varies can be realized.

APPLICATION EXAMPLE 12

According to one application example, there is provided an electronic device including:
any of the diagnostic circuits described above;
a first sensor that outputs a first sensor signal in accordance with a size of a physical quantity;
a second sensor that outputs a second sensor signal in accordance with a size of a physical quantity; and
a processing circuit,
the processing circuit performing:
a noise amount calculating process of calculating a first noise amount included in the first sensor signal and a second noise amount included in the second sensor signal; and
a selecting process of selecting any of the first sensor signal and the second sensor signal in accordance with the first noise amount and the second noise amount.

According to the above application example, since a diagnostic circuit which enables diagnosis of a connection state of a capacitor during an operation of a circuit that receives supply of power from a regulator is provided, an electronic device capable of operating in a stable manner can be realized.

In addition, by calculating noise amounts included in a plurality of sensor signals and selecting an appropriate sensor signal in accordance with the respective noise amounts, an electronic device capable of operating with high reliability even when the noise amounts of the respective sensor signals vary can be realized.

APPLICATION EXAMPLE 13

According to one application example, there is provided a mobile body including any of the diagnostic circuits described above.

According to the above application example, since a diagnostic circuit which enables diagnosis of a connection state of a capacitor during an operation of a circuit that receives supply of power from a regulator is provided, a mobile body capable of operating in a stable manner can be realized.

DETAILED DESCRIPTION

Hereinafter, preferable embodiments of the invention will be described in detail with reference to the drawings. The drawings are provided for convenience of description. It is to be understood that the following embodiments do not unduly limit the contents of the invention described in the claims. It is also to be understood that all of the components described below should not necessarily be taken as essential components of the invention.

1. Diagnostic Circuit, Electronic Circuit, and Physical Quantity Detection Apparatus 1-1. First Embodiment Hereinafter, while a physical quantity detection apparatus (an angular velocity detection apparatus) which detects angular velocity as a physical quantity will be described as an example, the invention can be applied to apparatuses capable of detecting any of a variety of physical quantities such as angular velocity, acceleration, geomagnetism, and pressure.

Figure 1:
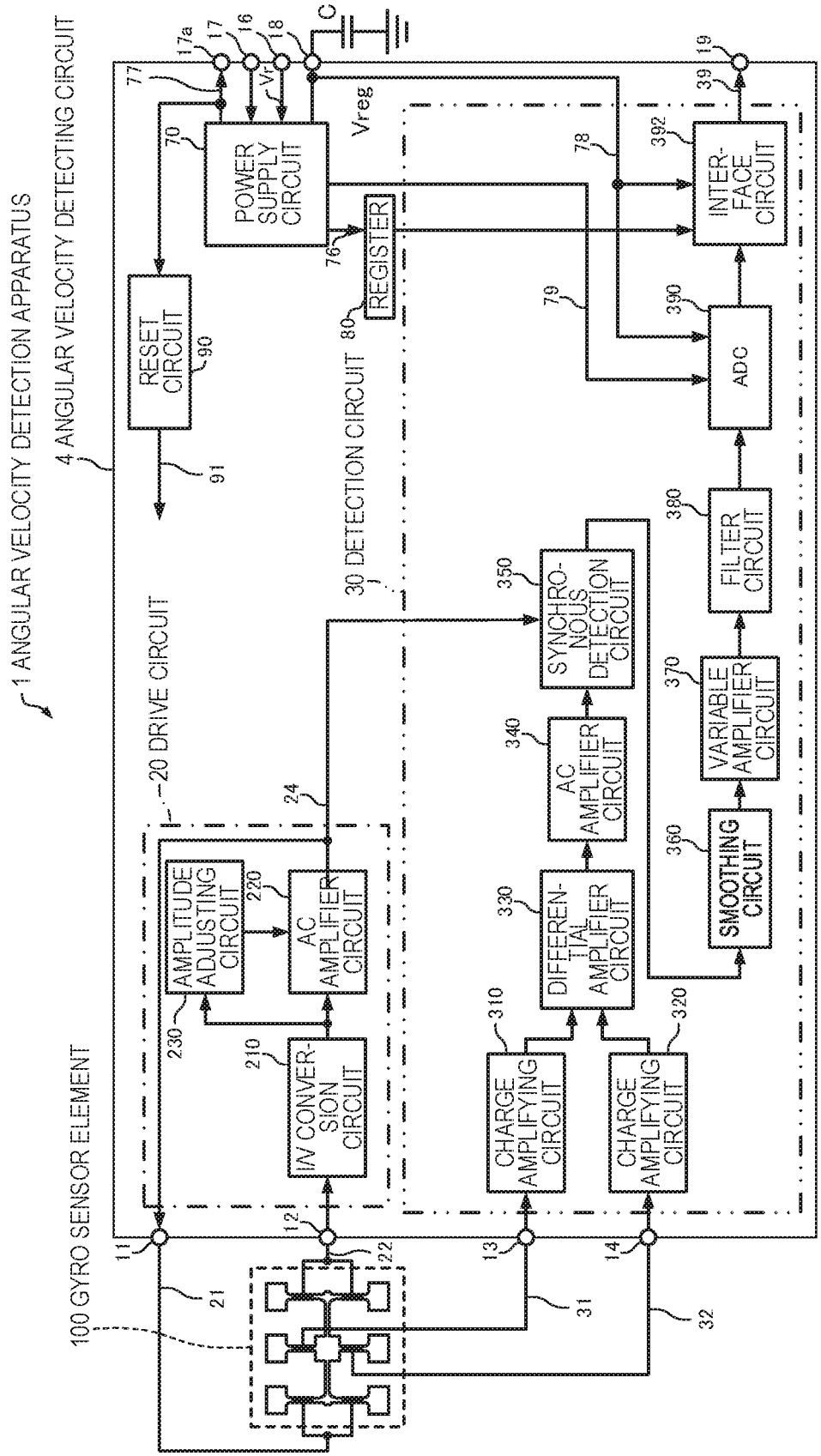
FIG. 1 is a diagram for explaining a configuration of an angular velocity detection apparatus according to a first embodiment of the invention.

FIG. 1 is a diagram for explaining a configuration of an angular velocity detection apparatus 1 according to a first embodiment of the invention.

The angular velocity detection apparatus 1 according to the first embodiment is configured so as to include a gyro sensor element 100 and an angular velocity detecting circuit 4 (an example of an electronic circuit).

The gyro sensor element 100 (an example of the physical quantity detection element according to the invention) is configured such that an oscillating piece on which are arranged a drive electrode and a detecting electrode is encapsulated in a package (not shown). Generally, airtightness inside the package is ensured in order to increase oscillation efficiency by minimizing impedance of the oscillating piece.

For example, the oscillating piece of the gyro sensor element 100 may be configured using a piezoelectric material including a piezoelectric single crystal such as crystal ($SiO_2$), lithium tantalate ($LiTaO_3$), and lithium niobate ($LiNbO_3$) and piezoelectric ceramics such as lead zirconate titanate (PZT), or the oscillating piece of the gyro sensor element 100 may be structured such that a piezoelectric thin film made of zinc oxide (ZnO), aluminum nitride (AlN), or the like and sandwiched between drive electrodes is arranged on a part of a surface of a silicon semiconductor.

In addition, for example, the oscillating piece may be a so-called double-T type having two T-type driving oscillating arms, a tuning fork type, a tuning bar type with a triangular prism shape, a quadratic prism shape, a cylindrical shape, or the like.

In the first embodiment, the gyro sensor element 100 is constituted by a double-T oscillating piece made of crystal.

Figure 2:
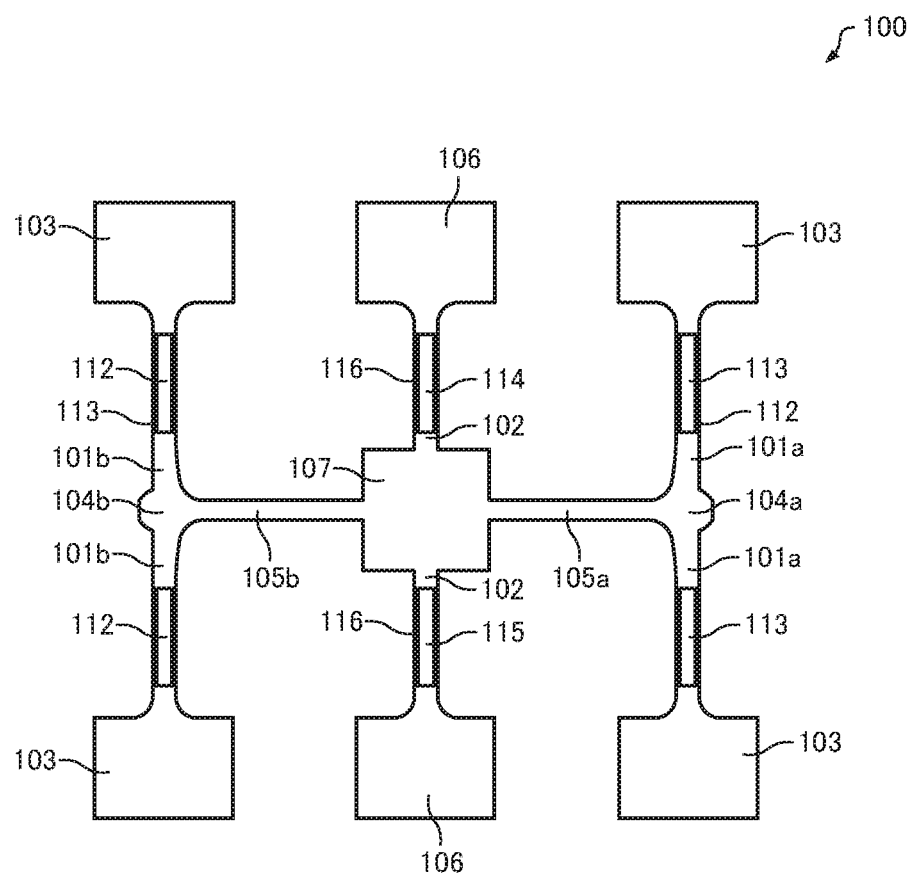
FIG. 2 is a plan view of an oscillating piece of a gyro sensor element.

FIG. 2 is a plan view of the oscillating piece of the gyro sensor element 100 according to the first embodiment.

The gyro sensor element 100 according to the first embodiment has a double-T oscillating piece formed from a z-cut crystal substrate. With an oscillating piece made of crystal, since a fluctuation in resonance frequency with respect to temperature variation is extremely small, detection accuracy of angular velocity can be advantageously increased. Moreover, an X axis, a Y axis, and a Z axis in FIG. 2 represent axes of a crystal.

As illustrated in FIG. 2, in the oscillating piece of the gyro sensor element 100, driving oscillating arms 101a and 101b respectively extend in a +Y axis direction and a −Y axis direction from two driving bases 104a and 104b. Drive electrodes 112 and 113 are respectively formed on a side surface and a top surface of the driving oscillating arm 101a, and drive electrodes 113 and 112 are respectively formed on a side surface and a top surface of the driving oscillating arm 101b. The drive electrodes 112 and 113 are respectively connected to a drive circuit 20 via an external output terminal 11 and an external input terminal 12 of the angular velocity detecting circuit 4 in FIG. 1.

The driving bases 104a and 104b are coupled to a rectangular detecting base 107 via coupling arms 105a and 105b respectively extending in a −X axis direction and a +X axis direction.

A detecting oscillating arm 102 extends in the +Y axis direction and the −Y axis direction from the detecting base 107. Detecting electrodes 114 and 115 are formed on a top surface of the detecting oscillating arm 102, and a common electrode 116 is formed on a side surface of the detecting oscillating arm 102. The detecting electrodes 114 and 115 are respectively connected to a detecting circuit 30 via external input terminals 13 and 14 of the angular velocity detecting circuit 4 in FIG. 1. In addition, the common electrode 116 is grounded.

Figure 3:
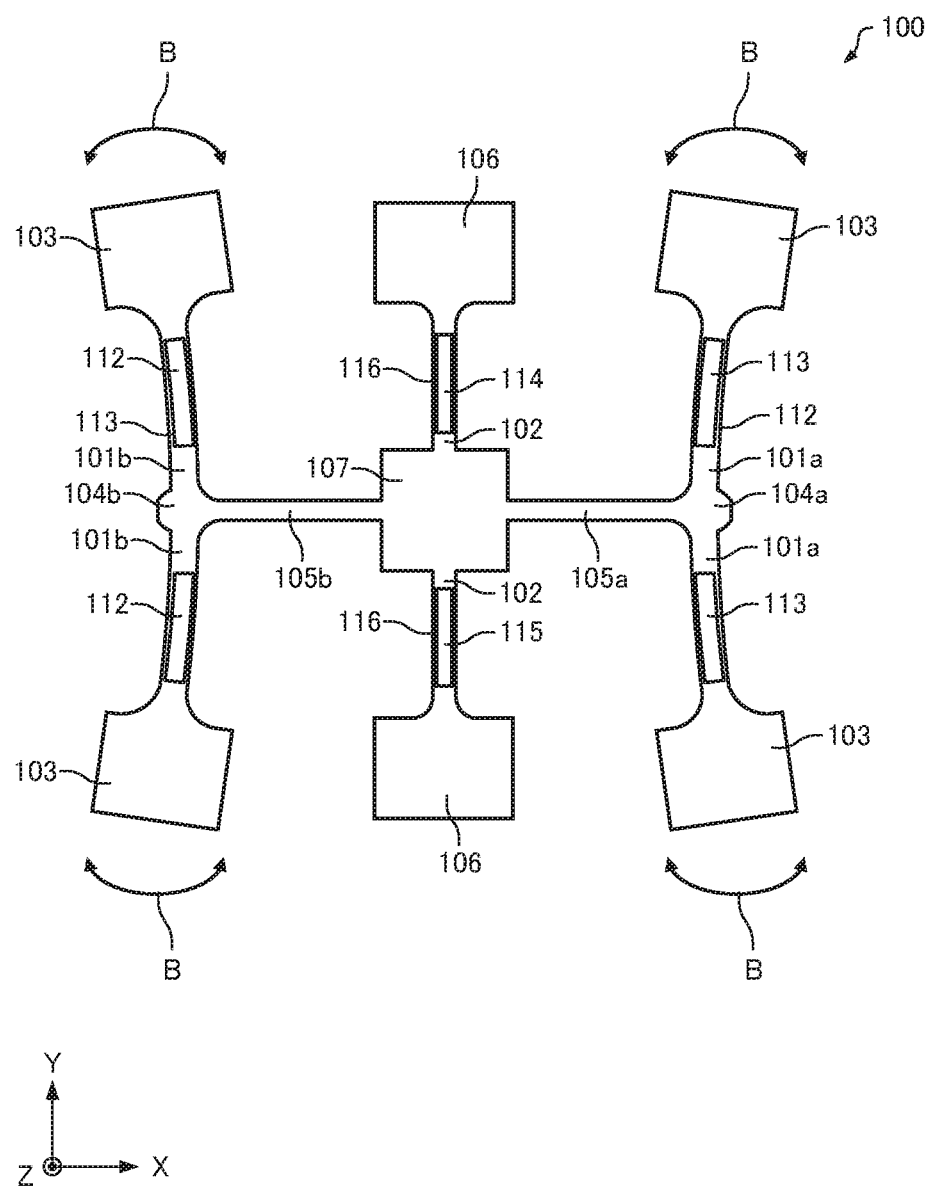
FIG. 3 is a diagram for explaining an operation of a gyro sensor element.

When AC voltage is applied as a drive signal between the drive electrode 112 and the drive electrode 113 of the driving oscillating arms 101a and 101b, as illustrated in FIG. 3, due to an inverse piezoelectric effect, the driving oscillating arms 101a and 101b perform bending oscillation (exciting oscillation) in which tips of the two driving oscillating arms 101a and 101b repetitively approach and separate from each other as depicted by arrows B.

Moreover, in the present application, when magnitudes of oscillation energy or magnitudes of amplitude of oscillation are equal between the two driving oscillating arms when the respective driving oscillating arms perform bending oscillation (exciting oscillation) in a state where angular velocity is not applied to the gyro sensor element 100, oscillation energy of the driving oscillating arms is described as being balanced.

Figure 4:
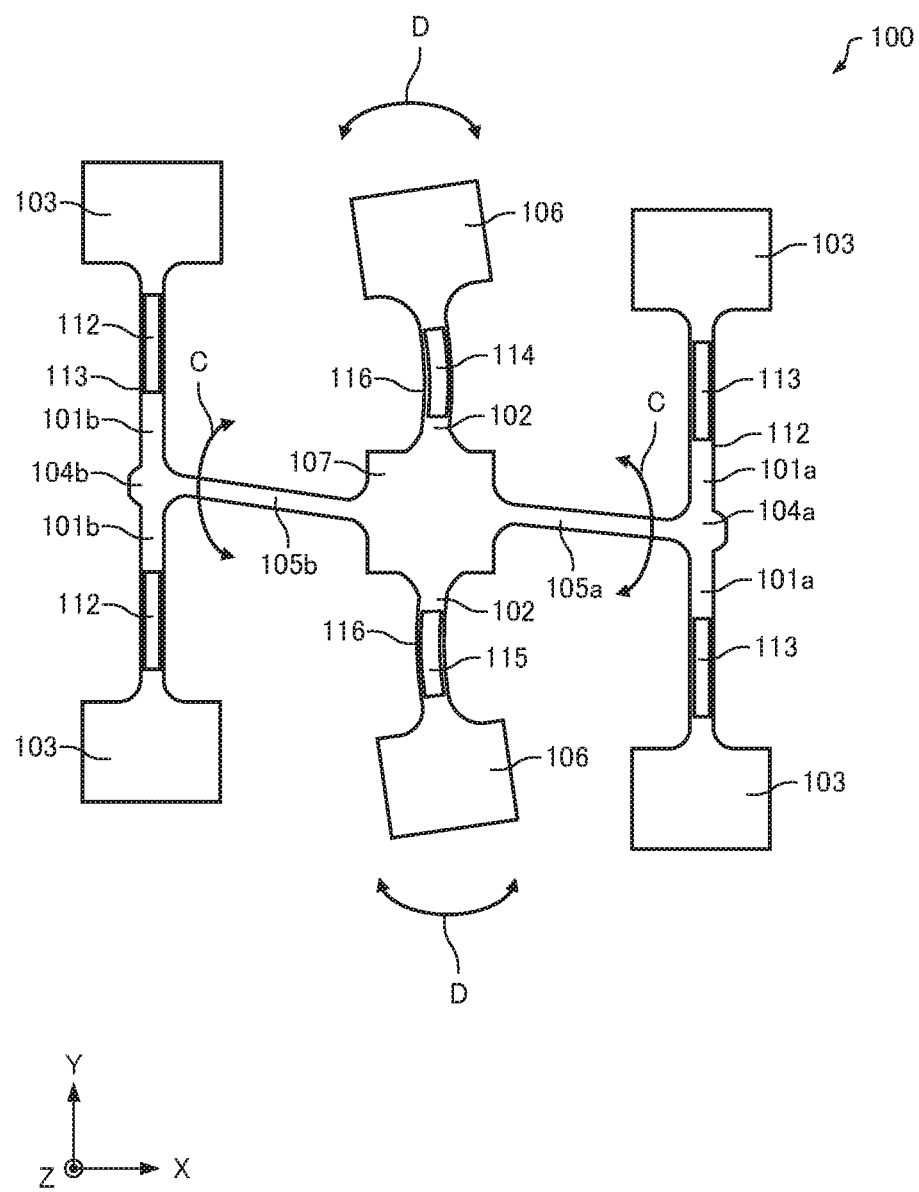
FIG. 4 is a diagram for explaining an operation of a gyro sensor element.

In this state, when angular velocity with the Z axis as a rotational axis is applied to the oscillating piece of the gyro sensor element 100, the driving oscillating arms 101a and 101b obtain Coriolis force in a direction perpendicular to both a direction of the bending oscillation indicated by the arrows B and the Z axis. As a result, as illustrated in FIG. 4, the coupling arms 105a and 105b oscillate as depicted by arrows C. In addition, the detecting oscillating arm 102 performs bending oscillation as depicted by arrows D in conjunction with the oscillation (the arrows C) of the coupling arms 105a and 105b.

Furthermore, once the balance of oscillation energy between the driving oscillating arms is disrupted due to manufacturing variation of the gyro sensor element 100 or the like, the exciting oscillation of the driving oscillating arms 101a and 101b generate leakage oscillation on the detecting oscillating arm 102. This leakage oscillation is bending oscillation depicted by the arrows D in a similar manner to oscillation based on Coriolis force but in a same phase as a drive signal. Moreover, oscillation accompanying Coriolis force and driving oscillation are 90° out of phase.

In addition, due to a piezoelectric effect, an alternating charge based on these bending oscillations is generated on the detecting electrodes 114 and 115 of the detecting oscillating arm 102. In this case, an alternating charge generated based on Coriolis force varies in accordance with a magnitude of the Coriolis force (in other words, a magnitude of angular velocity applied to the gyro sensor element 100). On the other hand, an alternating charge generated based on leakage oscillation is constant regardless of the magnitude of angular velocity applied to the gyro sensor element 100.

Moreover, in the configuration in FIG. 2, in order to improve the balance of the oscillating piece, the detecting base 107 is arranged at center and the detecting oscillating arm 102 is extended in both +Y and −Y directions from the detecting base 107. Furthermore, the coupling arms 105a and 105b are extended in both +X and −X directions from the detecting base 107, and the driving oscillating arms 101a and 101b are extended in both +Y and −Y directions from each of the coupling arms 105a and 105b.

In addition, a rectangular weight section 103 with a wider width than the driving oscillating arms 101a and 101b is formed at tips of the driving oscillating arms 101a and 101b. By forming the weight section 103 at the tips of the driving oscillating arms 101a and 101b, Coriolis force can be increased and, at the same time, a desired resonance frequency can be obtained with a relatively short oscillating arm. In a similar manner, a weight section 106 with a wider width than the detecting oscillating arm 102 is formed at a tip of the detecting oscillating arm 102. By forming the weight section 106 at the tip of the detecting oscillating arm 102, the alternating charge generated at the detecting electrodes 114 and 115 can be increased.

As described above, with the Z axis as a detection axis, the gyro sensor element 100 outputs an alternating charge (in other words, a detection signal) based on Coriolis force and an alternating charge (in other words, a leakage signal) based on leakage oscillation of exciting oscillation via the detecting electrodes 114 and 115.

Returning to FIG. 1, the angular velocity detecting circuit 4 is configured so as to include the drive circuit 20, the detecting circuit 30, and a power supply circuit 70.

The drive circuit 20 generates a drive signal 21 for causing exciting oscillation of the gyro sensor element 100 and supplies the drive signal 21 to the drive electrode 112 of the gyro sensor element 100 via the external output terminal 11. In addition, a drive signal 22 generated on the drive electrode 113 by the exciting oscillation of the gyro sensor element 100 is input to the drive circuit 20 via the external input terminal 12, in which case the drive circuit 20 performs feedback control of an amplitude level of the drive signal 21 so that an amplitude of the drive signal 22 is kept constant. Furthermore, the drive circuit 20 generates a detection signal for a synchronous detecting circuit 350 included in the detecting circuit 30.

The drive circuit 20 is configured so as to include an I/V conversion circuit (a current/voltage conversion circuit) 210, an AC amplifier circuit 220, and an amplitude adjusting circuit 230.

A drive current flowing to the oscillating piece of the gyro sensor element 100 is converted into an AC voltage signal by the I/V conversion circuit 210.

An AC voltage signal output from the I/V conversion circuit 210 is input to the AC amplifier circuit 220 and the amplitude adjusting circuit 230. The AC amplifier circuit 220 amplifies the input AC voltage signal, clips the amplified AC voltage signal at a predetermined voltage value, and outputs a square-wave voltage signal 24. The amplitude adjusting circuit 230 causes an amplitude of the square-wave voltage signal 24 to vary in accordance with a level of the AC voltage signal output by the I/V conversion circuit 210, and controls the AC amplifier circuit 220 so that a drive current is kept constant.

The square-wave voltage signal 24 is supplied as the drive signal 21 to the drive electrode 112 of the oscillating piece of the gyro sensor element 100 via the external output terminal 11. In this manner, the gyro sensor element 100 continuously generates predetermined driving oscillation as illustrated in FIG. 3. In addition, by keeping the drive current constant, the driving oscillating arms 101a and 101b of the gyro sensor element 100 can obtain a constant oscillating velocity. Therefore, an oscillating velocity which acts as a generation source of Coriolis force becomes constant and, consequently, sensitivity can be further stabilized.

Alternating charges (detection currents) 31 and 32 generated on the detecting electrodes 114 and 115 of the gyro sensor element 100 are respectively input to the detecting circuit 30 via the external input terminals 13 and 14, in which case the detecting circuit 30 extracts a desired component included in these alternating charges (detection currents).

The detecting circuit 30 is configured so as to include charge amplifying circuits 310 and 320, a differential amplifier circuit 330, an AC amplifier circuit 340, a synchronous detecting circuit 350, a smoothing circuit 360, a variable amplifier circuit 370, a filter circuit 380, and a phase changing circuit 352.

An alternating charge constituted by a detection signal and a leakage signal is input to the charge amplifying circuit 310 from the detecting electrode 114 of the oscillating piece of the gyro sensor element 100 via the external input terminal 13.

In a similar manner, an alternating charge constituted by a detection signal and a leakage signal is input to the charge amplifying circuit 320 from the detecting electrode 115 of the oscillating piece of the gyro sensor element 100 via the external input terminal 14.

The charge amplifying circuits 310 and 320 convert respectively input alternating charges into AC voltage signals with a reference voltage Vref as a reference. Moreover, the reference voltage Vref is generated by a reference power supply circuit (not shown) based on external power input from a power input terminal.

The differential amplifier circuit 330 differentially amplifies an output signal of the charge amplifying circuit 310 and an output signal of the charge amplifying circuit 320. The differential amplifier circuit 330 is for canceling an in-phase component while adding and amplifying a reverse phase component.

The AC amplifier circuit 340 amplifies an output signal of the differential amplifier circuit 330. The output signal of the AC amplifier circuit 340 includes a detection signal and a leakage signal and is input as a detected signal to the synchronous detecting circuit 350.

The synchronous detecting circuit 350 performs synchronous detection with respect to the detected signal using the square-wave voltage signal 24 as a detection signal. For example, the synchronous detecting circuit 350 can be configured as a switching circuit which selects an output signal of the AC amplifier circuit 340 when a voltage level of a detection signal 34 is higher than the reference voltage Vref and which selects a signal obtained by inverting the output signal of the AC amplifier circuit 340 with respect to the reference voltage Vref when the voltage level of the detection signal 34 is lower than the reference voltage Vref.

An output signal of the synchronous detecting circuit 350 is smoothed into a DC voltage signal by the smoothing circuit 360 and subsequently input to the variable amplifier circuit 370.

The variable amplifier circuit 370 amplifies (or damps) the output signal of the smoothing circuit 360 (the DC voltage signal) at a set amplification factor (or a set damping factor) to adjust detection sensitivity. The signal amplified (or damped) by the variable amplifier circuit 370 is input to the filter circuit 380.

The filter circuit 380 is a circuit which limits an output signal of the variable amplifier circuit 370 to a frequency band suitable for use. An output signal of the filter circuit 380 is converted into angular velocity information which is a digital value by an ADC (Analog-to-digital converter) 390. Subsequently, a sensor signal including angular velocity information is output to the outside as a digital signal 39 via an interface circuit 392 and an external output terminal 19.

The power supply circuit 70 receives supply of a voltage Vr and outputs a voltage Vreg. In the example in FIG. 1, the power supply circuit 70 receives supply of the voltage Vr from an external input terminal 16 and outputs the voltage Vreg to the ADC 390 and the interface circuit 392. In addition, the power supply circuit 70 receives input of a control signal from an external input terminal 17. Furthermore, the power supply circuit 70 outputs an error information signal 77 to an external output terminal 17a.

Moreover, the angular velocity detection apparatus 1 may be configured by omitting a part of the components described above or by adding a new component thereto.

Figure 5:
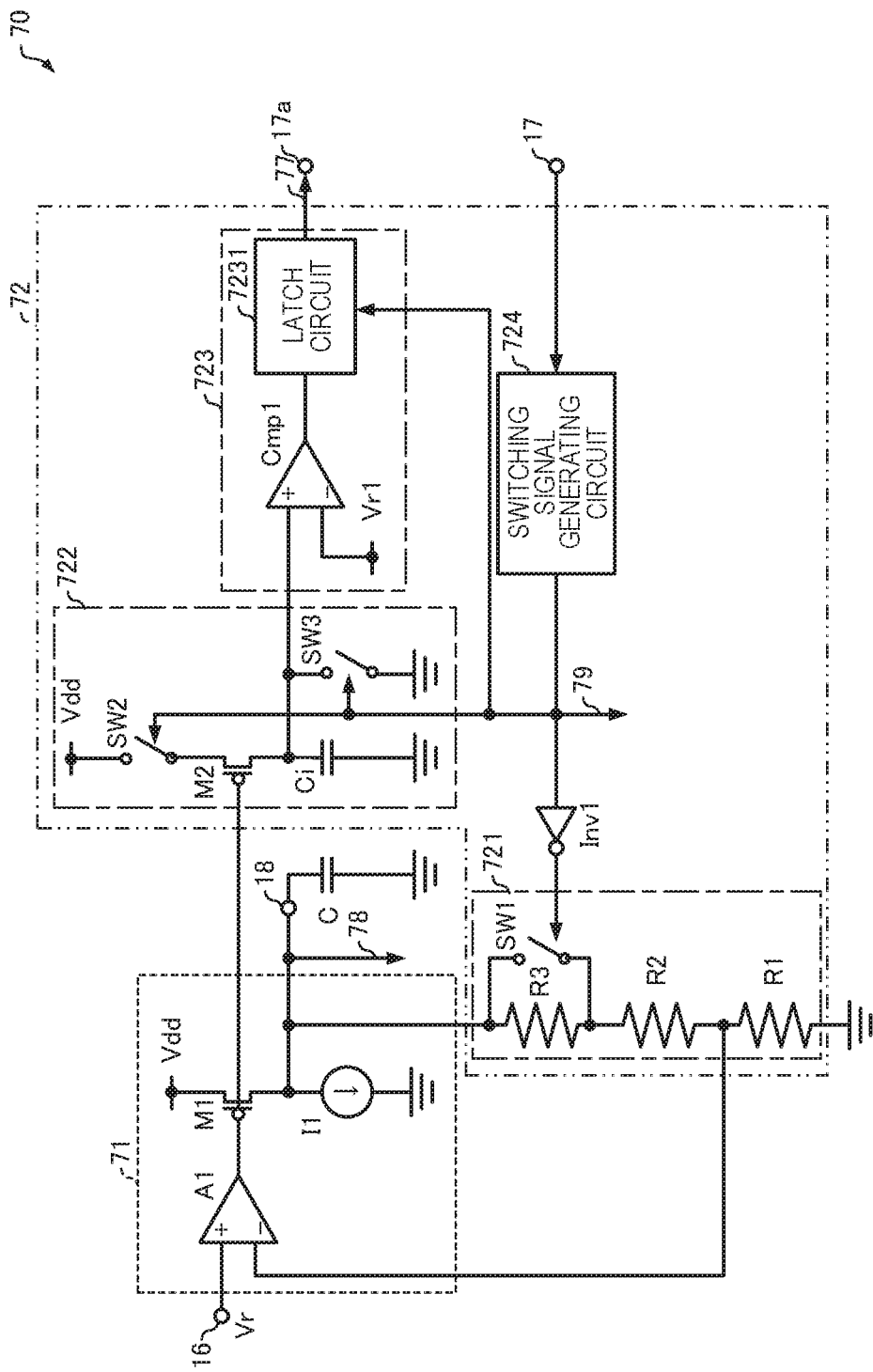
FIG. 5 is a circuit diagram of a power supply circuit according to the first embodiment.

FIG. 5 is a circuit diagram of the power supply circuit 70 according to the first embodiment. The power supply circuit 70 is configured so as to include a regulator 71 and a diagnostic circuit 72.

The regulator 71 normally outputs a first voltage. A capacitor C is connected to an output terminal of the regulator 71 (an external output terminal 18).

In the example in FIG. 5, the regulator 71 is a push-type regulator configured so as to include an amplifier circuit A1, a PMOS transistor M1, and a current source circuit I1. The voltage Vr is input from the external input terminal 16 to a non-inverting input terminal of the amplifier circuit A1. An output terminal of the amplifier circuit A1 is connected to a gate of the PMOS transistor M1. The PMOS transistor M1 and the current source circuit I1 are sequentially connected in series between a power supply and ground. A source of the PMOS transistor M1 is connected to the power supply, and a drain of the PMOS transistor M1 is connected to the current source circuit I1 and to the output terminal of the regulator 71 (the external output terminal 18). An output voltage 78 of the regulator 71 is supplied to the ADC 390 and the interface circuit 392 in FIG. 1.

The diagnostic circuit 72 is the diagnostic circuit 72 which diagnoses a connection state of the capacitor C connected to the output terminal of the regulator 71 (the external output terminal 18) that normally outputs the first voltage. In the example in FIG. 5, the diagnostic circuit 72 is configured so as to include a switching circuit 721, a detecting circuit 722, a determining circuit 723, a switching signal generating circuit 724, and an inverter Inv1.

The switching circuit 721 performs a switching control process of switching the output voltage of the regulator 71 to a second voltage that is higher than the first voltage during a first period. A length of the first period may be either fixed or variable. In the example in FIG. 5, the switching circuit 721 is configured so as to include: resistors R1 to R3 connected in series between the output terminal of the regulator 71 and ground; and a switch SW1 provided in parallel with the resistor R3. A connection point between the resistor R1 and the resistor R2 is connected to an inverting input terminal of the amplifier circuit A1 of the regulator 71. The switch SW1 is normally controlled to an ON state but controlled to an OFF state during the switching control process. Due to the switch SW1 being controlled to the OFF state, the output voltage of the regulator 71 becomes the second voltage that is higher than the first voltage.

The detecting circuit 722 detects a variation in the output current of the regulator 71 caused by the switching control process. In the example in FIG. 5, the detecting circuit 722 is configured so as to include: a switch SW2, a PMOS transistor M2, and an internal capacitor Ci which are connected in series between the power supply and ground; and a switch SW3 provided in parallel with the internal capacitor Ci. A gate of the PMOS transistor M2 is connected to the gate of the PMOS transistor M1 of the regulator 71. In other words, the PMOS transistor M2 functions as a current mirror circuit which outputs a mirror current of the output current of the regulator 71 to one end of the internal capacitor Ci. A connection point between the PMOS transistor M2 and the internal capacitor Ci becomes an output terminal of the detecting circuit 722 and is connected to an input terminal of the determining circuit 723. The switches SW2 and SW3 are normally controlled to an OFF state but controlled to an ON state during the switching control process. Due to the switches SW2 and SW3 being controlled to the ON state, a variation in the output current of the regulator 71 can be detected.

The determining circuit 723 determines a connection state of the capacitor C based on a detection result of the detecting circuit 722. In the example in FIG. 5, the determining circuit 723 is configured so as to include a comparator Cmp1 and a latch circuit 7231. A non-inverting input terminal of the comparator Cmp1 becomes the input terminal of the determining circuit 723. A reference voltage Vr1 is input to an inverting input terminal of the comparator Cmp1. In other words, the comparator Cmp1 detects a variation in the output current of the regulator 71 by comparing a voltage at the one end of the internal capacitor Ci with the reference voltage Vr1. An output terminal of the comparator Cmp1 is connected to an input terminal of the latch circuit 7231. The latch circuit 7231 outputs a determination result as the error information signal 77 to the external output terminal 17a.

In the first embodiment, the angular velocity detecting circuit 4 includes a register 80. The register 80 is configured such that information stored therein can be output by the interface circuit 392 to the outside as the digital signal 39 via the external output terminal 19. In addition, the diagnostic circuit 72 may write error information into the register 80 when determining that the connection state of the capacitor C is anomalous. In the example in FIG. 5, the diagnostic circuit 72 includes a register write control circuit 725 which controls writing to the register 80. Based on the error information signal 77 output by the latch circuit 7231, the register write control circuit 725 outputs a write control signal 76 for writing error information representing the connection state of the capacitor C into the register 80.

The switching signal generating circuit 724 outputs a pulse signal to the switching circuit 721 based on a control signal input from the external input terminal 17. In the example in FIG. 5, the switching signal generating circuit 724 outputs the pulse signal to the switch SW1 of the switching circuit 721 via the inverter Inv1. The switch SW1 is controlled to an OFF state only during a period in which an inversion signal of the pulse signal is input. In other words, the switching circuit 721 switches the output voltage of the regulator 71 to the second voltage based on a pulse signal from the switching signal generating circuit 724. In addition, the switching signal generating circuit 724 outputs a pulse signal to the switches SW2 and SW3. The switches SW2 and SW3 are controlled to an ON state only during a period in which the pulse signal is input. Furthermore, the switching signal generating circuit 724 outputs a pulse signal to a reset terminal of the latch circuit 7231. The latch circuit 7231 is reset at a timing of rising of the pulse signal. In addition, the switching signal generating circuit 724 outputs a pulse signal to the ADC 390 as a control signal 79.

Next, an operation of the diagnostic circuit 72 will be described. As described above, normally, the switch SW1 is in the OFF state, the switches SW2 and SW3 are in the ON state, and the regulator 71 is outputting the first voltage.

During the switching control process, the switching signal generating circuit 724 outputs a pulse signal with a pulse width corresponding to the first period. Accordingly, since the switch SW1 is controlled to the OFF state, the regulator 71 outputs the second voltage that is higher than the first voltage. When the capacitor C is connected to the output terminal of the regulator 71 (the external output terminal 18), since the output voltage of the regulator 71 rises while charging the capacitor C, a large current flows through the PMOS transistor M1. On the other hand, when the capacitor C is not connected to the output terminal of the regulator 71 (the external output terminal 18), the output voltage of the regulator 71 rises swiftly, a large current does not flow from the PMOS transistor M1, and the output current of the PMOS transistor M1 is absorbed by the current source circuit I1.

During the switching control process, since the switches SW2 and SW3 are controlled to the ON state, a mirror current of the PMOS transistor M1 flows through the PMOS transistor M2 of the detecting circuit 722 and charges the internal capacitor Ci. When the capacitor C is connected to the output terminal of the regulator 71 (the external output terminal 18), since a large mirror current also flows through the PMOS transistor M2, the internal capacitor Ci is charged in a short period of time. On the other hand, when the capacitor C is not connected to the output terminal of the regulator 71 (the external output terminal 18), since a large mirror current does not flow through the PMOS transistor M2, the internal capacitor Ci is charged over a long period of time.

When the voltage at the one end of the internal capacitor Ci exceeds the reference voltage Vr1 during the first period in which the switching control process is performed, the comparator Cmp1 outputs a high level and information describing that the capacitor C is normally connected is stored in the latch circuit 7231. On the other hand, when the voltage at the one end of the internal capacitor Ci does not exceed the reference voltage Vr1, the comparator Cmp1 outputs a low level and information describing that the capacitor C is not normally connected is stored in the latch circuit 7231.

According to the first embodiment, since a connection state of the capacitor C can be diagnosed by switching the output voltage of the regulator 71 to the second voltage that is higher than the first voltage in the first period, the diagnostic circuit 72 which enables diagnosis of the connection state of the capacitor C during an operation of a circuit that receives supply of power from the regulator 71 can be realized. In addition, the diagnostic circuit 72 which enables diagnosis of the connection state of the capacitor C can be realized with a simple configuration.

The angular velocity detecting circuit 4 (an electronic circuit) includes: the diagnostic circuit 72; a circuit block (the ADC 390 and the interface circuit 392) to which power is supplied from the regulator 71; and a control circuit (in the first embodiment, the switching signal generating circuit 724 doubles as the control circuit) which, during the first period, sets a part of the circuit block (in the first embodiment, the ADC 390) to a non-operating state. The switching signal generating circuit 724 controls the ADC 390 to a non-operating state in the first period by outputting the control signal 79 to the ADC 390.

According to the first embodiment, the angular velocity detecting circuit 4 (an electronic circuit) can be realized which enables output with high reliability in the first period by, for example, changing a part of a circuit block in which high accuracy with respect to a power-supply voltage is required to a non-operating state.

The angular velocity detecting circuit 4 includes a reset circuit 90 which outputs a reset signal 91 for performing an initialization sequence of the angular velocity detecting circuit 4.

The reset circuit 90 outputs the reset signal 91 when the error information signal 77 indicating that the connection state of the capacitor C that is a diagnosis target is anomalous is input from the diagnostic circuit 72 included in the power supply circuit 70. Once the reset signal 91 is output, the initialization sequence of the angular velocity detecting circuit 4 is started. The initialization sequence may include, for example, a step of setting an adjustment value read from a non-volatile memory (not shown) included in the angular velocity detecting circuit 4 as the amplification factor of the AC amplifier circuit 220 included in the drive circuit 20 and a step of setting an adjustment value stored in a non-volatile memory (not shown) as the amplification factor of the I/V conversion circuit 210.

Furthermore, the reset circuit 90 may perform an initialization sequence of the angular velocity detecting circuit 4 once a predetermined period of time lapses after power is supplied to the angular velocity detecting circuit 4.

1-2. Modification of Diagnostic Circuit

Figure 6:
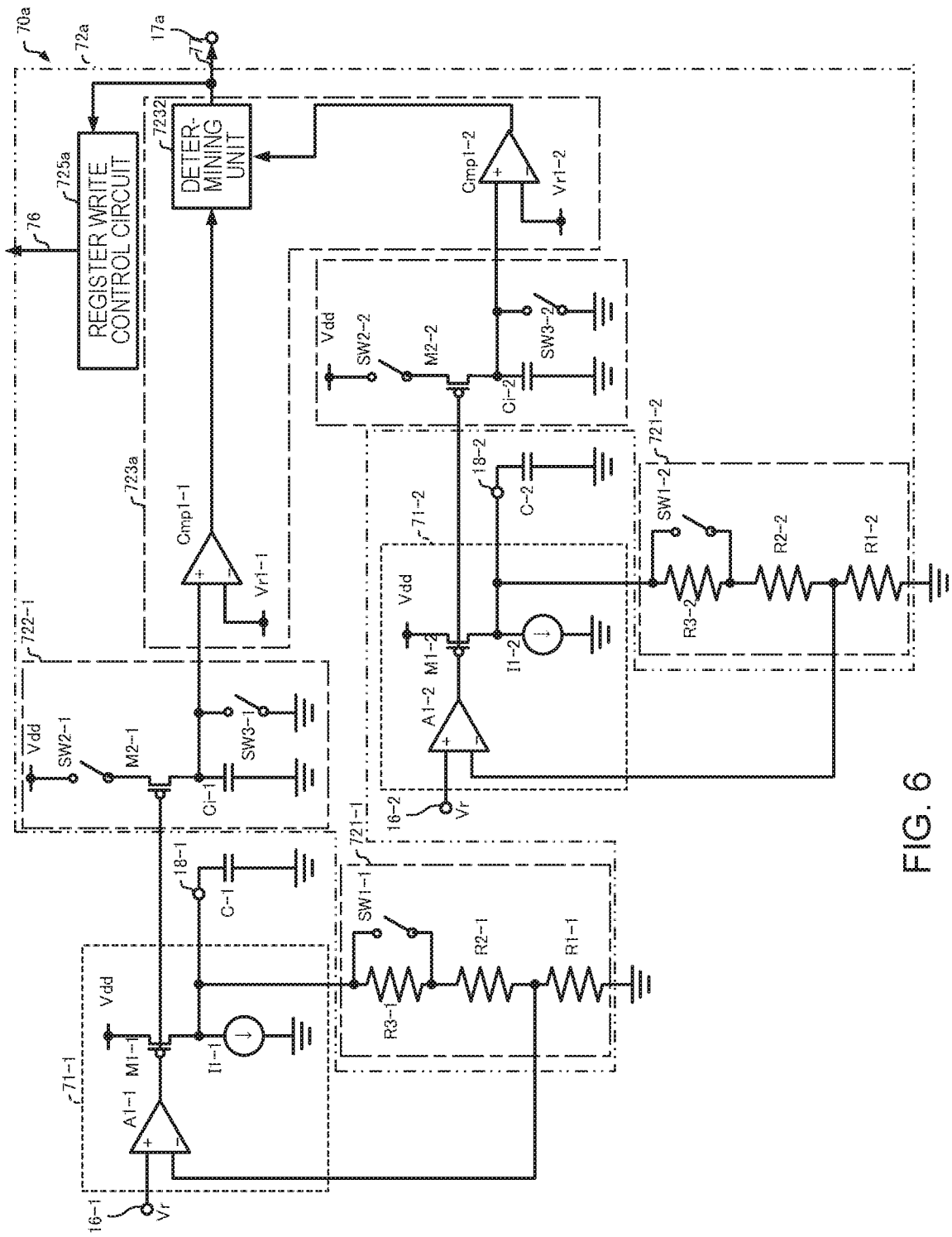
FIG. 6 is a circuit diagram of a power supply circuit according to a modification.

FIG. 6 is a circuit diagram of a power supply circuit 70*a* according to a modification. The power supply circuit 70*a* is configured so as to include a first regulator 71-1, a second regulator 71-2, and a diagnostic circuit 72*a*.

The first regulator 71-1 normally outputs a first voltage. A first capacitor C-1 is connected to an output terminal of the first regulator 71-1 (an external output terminal 18-1).

In the example in FIG. 6, the first regulator 71-1 is a push-type regulator configured so as to include an amplifier circuit A1-1, a PMOS transistor M1-1, and a current source circuit I1-1. The voltage Vr is input from an external input terminal 16-1 to a non-inverting input terminal of the amplifier circuit A1-1. An output terminal of the amplifier circuit A1-1 is connected to a gate of the PMOS transistor M1-1. The PMOS transistor M1-1 and the current source circuit I1-1 are sequentially connected in series between a power supply and ground. A source of the PMOS transistor M1-1 is connected to the power supply, and a drain of the PMOS transistor M1-1 is connected to the current source circuit I1-1 and to the output terminal of the first regulator 71-1 (the external output terminal 18-1).

The second regulator 71-2 normally outputs a third voltage. A second capacitor C-2 is connected to an output terminal of the second regulator 71-2 (an external output terminal 18-2).

In the example in FIG. 6, the second regulator 71-2 is a push-type regulator configured so as to include an amplifier circuit A1-2, a PMOS transistor M1-2, and a current source circuit I1-2. The voltage Vr is input from an external input terminal 16-2 to a non-inverting input terminal of the amplifier circuit A1-2. An output terminal of the amplifier circuit A1-2 is connected to a gate of the PMOS transistor M1-2. The PMOS transistor M1-2 and the current source circuit I1-2 are sequentially connected in series between a power supply and ground. A source of the PMOS transistor M1-2 is connected to the power supply, and a drain of the PMOS transistor M1-2 is connected to the current source circuit I1-2 and to the output terminal of the second regulator 71-2 (the external output terminal 18-2).

The diagnostic circuit 72*a* is the diagnostic circuit 72*a* which diagnoses connection states of the first capacitor C-1 connected to the output terminal of the first regulator 71-1 (the external output terminal 18-1) that normally outputs the first voltage and the second capacitor C-2 connected to the output terminal of the second regulator 71-2 (the external output terminal 18-2) that normally outputs the third voltage. In the example in FIG. 6, the diagnostic circuit 72*a* is configured so as to include a first switching circuit 721-1, a second switching circuit 721-2, a detecting circuit 722-1, a detecting circuit 722-2, and a determining circuit 723*a*.

The first switching circuit 721-1 performs a switching control process of switching the output voltage of the first regulator 71-1 to a second voltage that is higher than the first voltage during the first period. A length of the first period may be either fixed or variable. In the example in FIG. 6, the first switching circuit 721-1 is configured so as to include: resistors R1-1 to R3-1 connected in series between the output terminal of the first regulator 71-1 and ground; and a switch SW1-1 provided in parallel with the resistor R3-1. A connection point between the resistor R1-1 and the resistor R2-1 is connected to an inverting input terminal of the amplifier circuit A1-1 of the first regulator 71-1. The switch SW1-1 is normally controlled to an ON state but controlled to an OFF state during the switching control process. Due to the switch SW1-1 being controlled to the OFF state, the output voltage of the first regulator 71-1 becomes the second voltage that is higher than the first voltage.

The detecting circuit 722-1 detects a variation in the output current of the first regulator 71-1 caused by the switching control process. In the example in FIG. 6, the detecting circuit 722-1 is configured so as to include: a switch SW2-1, a PMOS transistor M2-1, and a first internal capacitor Ci-1 which are connected in series between the power supply and ground; and a switch SW3-1 provided in parallel with the first internal capacitor Ci-1. A gate of the PMOS transistor M2-1 is connected to the gate of the PMOS transistor M1-1 of the first regulator 71-1. In other words, the PMOS transistor M2-1 functions as a first current mirror circuit which outputs a mirror current of the output current of the first regulator 71-1 to one end of the first internal capacitor Ci-1. A connection point between the PMOS transistor M2-1 and the first internal capacitor Ci-1 becomes an output terminal of the detecting circuit 722-1 and is connected to a first input terminal of the determining circuit 723a. The switches SW2-1 and SW3-1 are normally controlled to an OFF state but controlled to an ON state during the switching control process. Due to the switches SW2-1 and SW3-1 being controlled to the ON state, a variation in the output current of the first regulator 71-1 can be detected.

The second switching circuit 721-2 performs a switching control process of switching the output voltage of the second regulator 71-2 to a fourth voltage that is higher than the third voltage during the first period. In the example in FIG. 6, the second switching circuit 721-2 is configured so as to include: resistors R1-2 to R3-2 connected in series between the output terminal of the second regulator 71-2 and ground; and a switch SW1-2 provided in parallel with the resistor R3-2. A connection point between the resistor R1-2 and the resistor R2-2 is connected to an inverting input terminal of the amplifier circuit A1-2 of the second regulator 71-2. The switch SW1-2 is normally controlled to an ON state but controlled to an OFF state during the switching control process. Due to the switch SW1-2 being controlled to the OFF state, the output voltage of the second regulator 71-2 becomes the fourth voltage that is higher than the third voltage.

The detecting circuit 722-2 detects a variation in the output current of the second regulator 71-2 caused by the switching control process. In the example in FIG. 6, the detecting circuit 722-2 is configured so as to include: a switch SW2-2, a PMOS transistor M2-2, and a second internal capacitor Ci-2 which are connected in series between the power supply and ground; and a switch SW3-2 provided in parallel with the second internal capacitor Ci-2. A gate of the PMOS transistor M2-2 is connected to the gate of the PMOS transistor M1-2 of the second regulator 71-2. In other words, the PMOS transistor M2-2 functions as a second current mirror circuit which outputs a mirror current of the output current of the second regulator 71-2 to one end of the second internal capacitor Ci-2. A connection point between the PMOS transistor M2-2 and the second internal capacitor Ci-2 becomes an output terminal of the detecting circuit 722-2 and is connected to a second input terminal of the determining circuit 723a. The switches SW2-2 and SW3-2 are normally controlled to an OFF state but controlled to an ON state during the switching control process. Due to the switches SW2-2 and SW3-2 being controlled to the ON state, a variation in the output current of the second regulator 71-2 can be detected.

The determining circuit 723a determines connection states of the first capacitor C-1 and the second capacitor C-2 based on detection results of the detecting circuits 722-1 and 722-2. In the example in FIG. 6, the determining circuit 723a is configured so as to include a first comparator Cmp1-1, a second comparator Cmp1-2, and a determining unit 7232.

A non-inverting input terminal of the first comparator Cmp1-1 becomes a first input terminal of the determining circuit 723a. A first reference voltage Vr1-1 is input to an inverting input terminal of the first comparator Cmp1-1. In other words, the first comparator Cmp1-1 detects a variation in the output current of the first regulator 71-1 by comparing a voltage at the one end of the first internal capacitor Ci-1 with the first reference voltage Vr1-1. An output terminal of the first comparator Cmp1-1 is connected to a first input terminal of the determining unit 7232.

A non-inverting input terminal of the second comparator Cmp1-2 becomes a second input terminal of the determining circuit 723a. A second reference voltage Vr1-2 is input to an inverting input terminal of the second comparator Cmp1-2. In other words, the second comparator Cmp1-2 detects a variation in the output current of the second regulator 71-2 by comparing a voltage at the one end of the second internal capacitor Ci-2 with the second reference voltage Vr-2. An output terminal of the second comparator Cmp1-2 is connected to a second input terminal of the determining unit 7232.

The determining unit 7232 determines connection states of the first capacitor C-1 and the second capacitor C-2 based on a time required by the voltage at the one end of the first internal capacitor Ci-1 to exceed the first reference voltage Vr1-1 and a time required by the voltage at the one end of the second internal capacitor Ci-2 to exceed the second reference voltage Vr1-2. For example, when the time required by the voltage at the one end of the first internal capacitor Ci-1 to exceed the first reference voltage Vr1-1 is longer than the time required by the voltage at the one end of the second internal capacitor Ci-2 to exceed the second reference voltage Vr1-2 by a predetermined period of time or more, since it is presumable that the first capacitor C-1 is not normally connected (a capacitance value of the first capacitor C-1 is too small or the first capacitor C-1 is not connected), a determination that the connection state of the first capacitor C-1 is anomalous is made. The determining unit 7232 outputs the determination result as the error information signal 77 to the external output terminal 17a.

According to this modification, since connection states of the first capacitor C-1 and the second capacitor C-2 can be diagnosed by switching the output voltage of the first regulator 71-1 to the second voltage that is higher than the first voltage and switching the output voltage of the second regulator 71-2 to the fourth voltage that is higher than the third voltage in the first period, the diagnostic circuit 72a which enables diagnosis of connection states of the first capacitor C-1 and the second capacitor C-2 during an operation of a circuit that receives supply of power from the first regulator 71-1 and the second regulator 71-2 can be realized.

In addition, the diagnostic circuit 72a which enables diagnosis of relative sizes of the capacitance value of the first capacitor C-1 and the capacitance value of the second capacitor C-2 by comparing a charge time of the first capacitor C-1 and a charge time of the second capacitor C-2 with each other can be realized.

In particular, highly accurate diagnosis can be readily realized when a current output capacity of the first regulator 71-1 is equal to a current output capacity of the second regulator 71-2, a voltage difference between the first voltage and the second voltage is equal to a voltage difference between the third voltage and the fourth voltage, and a capacitance value of the first capacitor C-1 is equal to a capacitance value of the second capacitor C-2.

The diagnostic circuit 72a may write error information into the register 80 when determining that the connection states of the first capacitor C-1 and the second capacitor C-2 are anomalous. In the example in FIG. 6, the diagnostic circuit 72a includes a register write control circuit 725a which controls writing to the register 80. Based on the error information signal 77 output by the determining unit 7232, the register write control circuit 725a outputs a write control signal 76 for writing error information representing the connection states of the first capacitor C-1 and the second capacitor C-2 into the register 80.

An operation of the reset circuit 90 when applying a power supply circuit 70*a* according to a modification in FIG. 6 in place of the power supply circuit 70 in FIG. 1 will be described. Detailed descriptions of components similar to those described above will be omitted. The reset circuit 90 outputs the reset signal 91 when the error information signal 77 indicating that the connection states of the first capacitor C-1 and the second capacitor C-2 which are diagnosis targets are anomalous is input from the diagnostic circuit 72*a*. In this case, the reset signal 91 may be output after changing a potential difference between the first voltage and the second voltage. Accordingly, by attempting to operate a circuit under conditions that differ from previous conditions, an appropriate circuit operation can be prompted.

1-3. Second Embodiment

Figure 7:
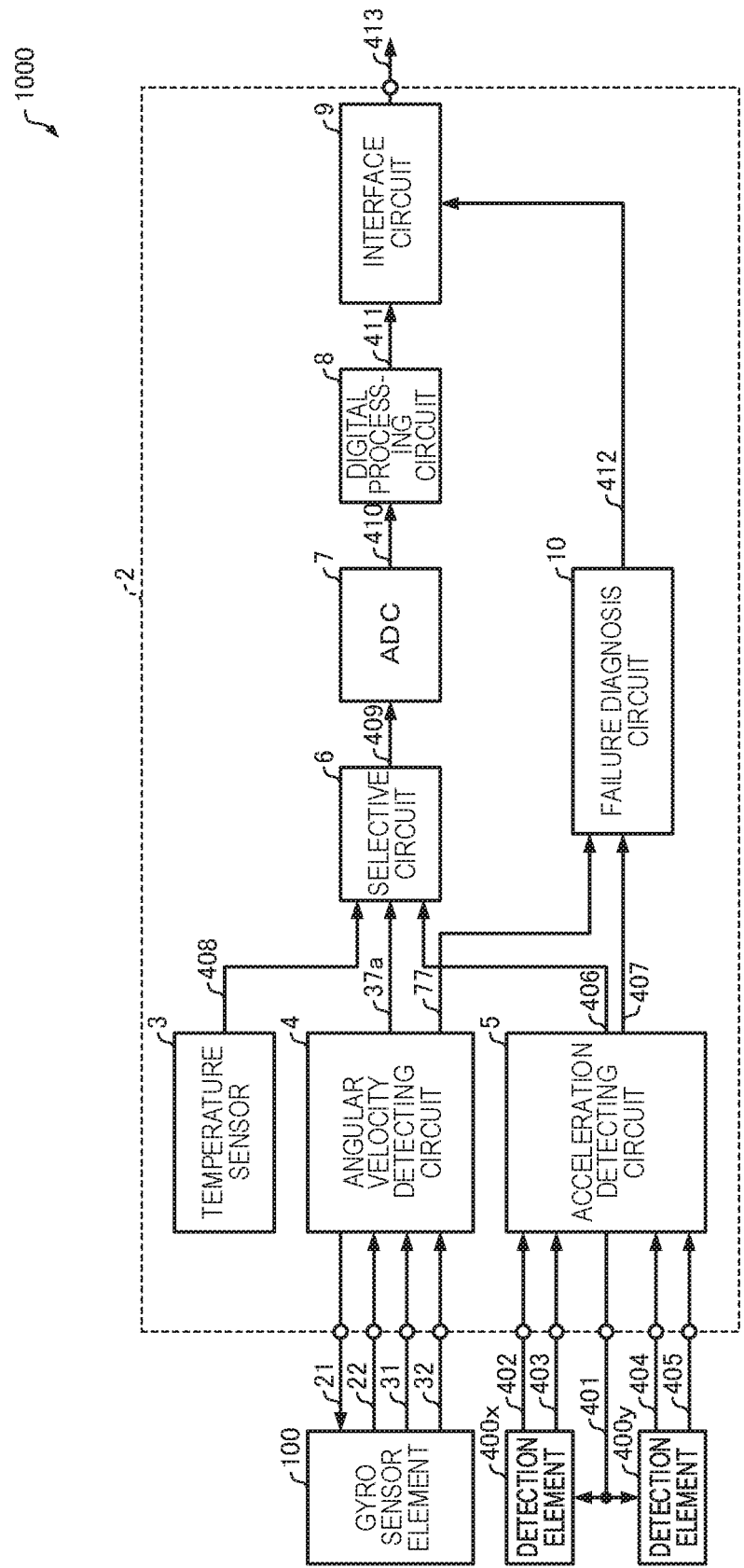
FIG. 7 is a functional block diagram of a physical quantity detection apparatus according to a second embodiment of the invention.

FIG. 7 is a functional block diagram of a physical quantity detection apparatus 1000 according to a second embodiment of the invention. Components similar to those of the first embodiment will be denoted by the same reference signs and detailed descriptions thereof will be omitted.

The physical quantity detection apparatus 1000 detects angular velocity in a uniaxial direction and acceleration in a biaxial direction as physical quantities. As components for detecting angular velocity, the physical quantity detection apparatus 1000 includes the gyro sensor element 100 and the angular velocity detecting circuit 4. As components for detecting acceleration, the physical quantity detection apparatus 1000 includes a detection element 400*x*, a detection element 400*y*, and an acceleration detecting circuit 5. In addition, the physical quantity detection apparatus 1000 includes a temperature sensor 3 in order to perform correction based on temperature.

The physical quantity detection apparatus 1000 according to the second embodiment further includes a selective circuit 6, an ADC (Analog-to-digital converter) 7, a digital processing circuit 8, an interface circuit 9, and a failure diagnosis circuit 10.

In the second embodiment, components other than the gyro sensor element 100, the detection element 400*x*, and the detection element 400*y* are configured as a physical quantity detecting circuit (an integrated circuit apparatus; an example of an electronic circuit) 2. Moreover, the physical quantity detection apparatus 1000 according to the second embodiment may be configured by omitting a part of these components (elements) or by adding other components (elements) thereto.

The temperature sensor 3 outputs a temperature signal 408 in accordance with temperature to the selective circuit 6.

The angular velocity detecting circuit 4 outputs a detection signal 37*a* in accordance with angular velocity to the selective circuit 6. In addition, the angular velocity detecting circuit 4 outputs the error information signal 77 to the failure diagnosis circuit 10.

The detection element 400*x* and the detection element 400*y* are constituted by capacitance type acceleration detection elements. The detection element 400*x* receives a carrier signal 401 from the acceleration detecting circuit 5 and differentially outputs a detection signal 402 and a detection signal 403 in accordance with detected acceleration to the acceleration detecting circuit 5. The detection element 400*y* receives the carrier signal 401 from the acceleration detecting circuit 5 and differentially outputs a detection signal 404 and a detection signal 405 in accordance with the detected acceleration to the acceleration detecting circuit 5.

Based on the detection signals 402 to 405, the acceleration detecting circuit 5 outputs an acceleration signal 406 in accordance with the acceleration to the selective circuit 6. In addition, the acceleration detecting circuit 5 outputs information related to an anomaly having occurred in the acceleration detecting circuit 5 as an error information signal 407 to the failure diagnosis circuit 10.

The selective circuit 6 sequentially selects one signal from the input signals and outputs the selected signal as a signal 409 to the ADC 7.

The ADC 7 converts an input signal into a digital signal and outputs the digital signal as a signal 410 to the digital processing circuit 8.

The digital processing circuit 8 performs a variety of digital processing on an input signal and outputs the processed signal as a signal 411 to the interface circuit 9. As the digital processing, for example, a filtering process or a process of correcting temperature characteristics may be performed.

Based on an input signal, the failure diagnosis circuit 10 determines whether or not an anomaly has occurred in at least any of the angular velocity detecting circuit 4, the acceleration detecting circuit 5, the gyro sensor element 100, the detection element 400*x*, and the detection element 400*y*, and outputs a determination result as a signal 412 to the interface circuit 9.

The interface circuit 9 converts an input signal into a predetermined communication format and outputs the converted signal as a signal 413 to the outside.

Even with the physical quantity detection apparatus 1000 according to the second embodiment, similar advantageous effects to the first embodiment can be produced due to similar reasons to the first embodiment.

2. Electronic Device

Figure 8:
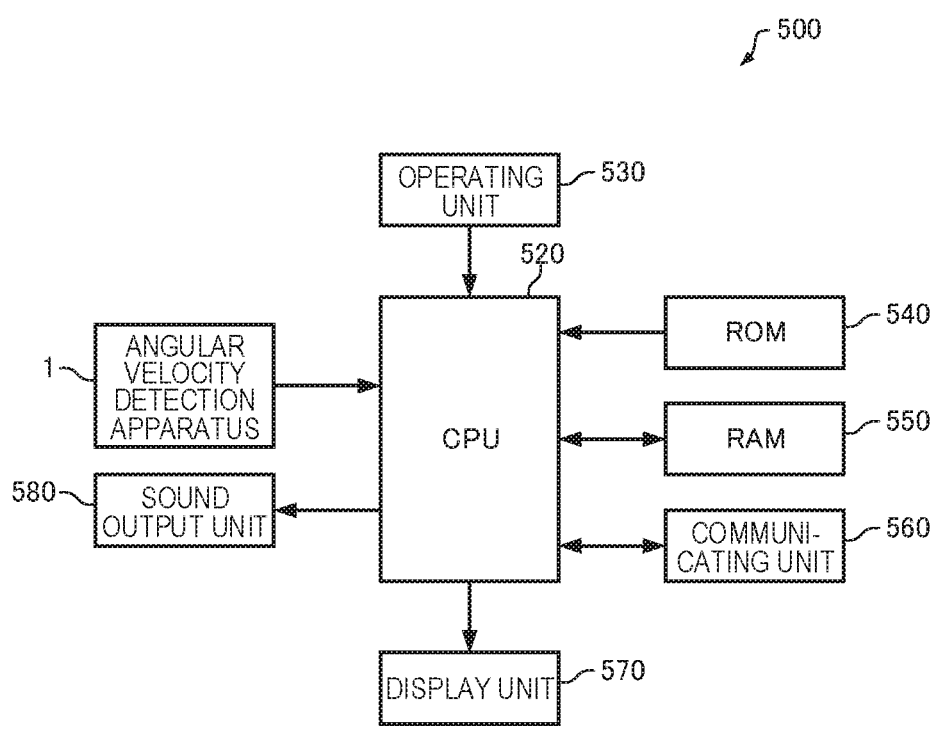
FIG. 8 is a functional block diagram of an electronic device according to one embodiment of the invention.

FIG. 8 is a functional block diagram of an electronic device 500 according to the one embodiment of the invention. Moreover, components similar to those of the respective embodiments described above will be denoted by the same reference signs and detailed descriptions thereof will be omitted.

The electronic device 500 according to this embodiment includes the angular velocity detection apparatus 1 (a physical quantity detection apparatus) as a sensor provided with the diagnostic circuit 72. In the example in FIG. 8, the electronic device 500 includes the angular velocity detection apparatus 1, a CPU (Central Processing Unit) 520, an operating unit 530, a ROM (Read Only Memory) 540, a RAM (Random Access Memory) 550, a communicating unit 560, a display unit 570, and a sound output unit 580. Moreover, the electronic device 500 may be configured by omitting or changing a part of the components (elements) in FIG. 9 or by adding a new component (element) thereto.

In accordance with programs stored in the ROM 540 and the like, the CPU 520 performs various calculation processes and control processes using a clock pulse output by a clock signal generation circuit (not shown). Specifically, the CPU 520 performs various processes in accordance with operating signals from the operating unit 530, a process of controlling the communicating unit 560 in order to perform data communication with the outside, a process of transmitting display signals for causing the display unit 570 to display various kinds of information, a process of causing the sound output unit 580 to output various sounds, and the like.

The operating unit 530 is an input apparatus constituted by operating keys, a button switch, or the like and outputs an operating signal in accordance with an operation by a user to the CPU 520.

The ROM 540 stores programs, data, and the like which enable the CPU 520 to perform various calculation processes and control processes.

The RAM 550 is used as a working area of the CPU 520, and the RAM 550 temporarily stores programs and data read from the ROM 540, data input from the operating unit 530, results of computations executed by the CPU 520 according to the various programs, and the like.

The communicating unit 560 performs a variety of control required to establish data communication between the CPU 520 and an external apparatus.

The display unit 570 is a display apparatus constituted by an LCD (Liquid Crystal Display), an electrophoretic display, or the like, and displays various kinds of information based on display signals input from the CPU 520.

In addition, the sound output unit 580 is an apparatus which outputs sound such as a speaker.

With the electronic device 500, since the diagnostic circuit 72 which enables diagnosis of the connection state of the capacitor C during an operation of a circuit that receives supply of power from the regulator 71 is provided, the electronic device 500 capable of operating in a stable manner can be realized.

In this embodiment, when receiving an error signal indicating that some kind of anomaly has occurred in the angular velocity detection apparatus 1 from the angular velocity detection apparatus 1, in order to specify a location where the anomaly has occurred, the CPU 520 may transmit, to the angular velocity detection apparatus 1, a command instructing the angular velocity detection apparatus 1 to perform an operation of determining a connection state of a capacitor using the angular velocity detecting circuit 4 according to the first or second embodiment described above.

In addition, in this embodiment, the CPU 520 may perform a noise amount calculating process of calculating a noise amount included in a sensor signal output from the angular velocity detection apparatus 1 and a determining process of determining that the calculated noise amount is larger than a threshold set in advance. Accordingly, the electronic device 500 capable of operating with high reliability even when a noise amount varies can be realized.

Furthermore, while an example in which the electronic device 500 includes one angular velocity detection apparatus 1 as a sensor has been described in this embodiment, the electronic device 500 may include two similar angular velocity detection apparatuses. In other words, the electronic device 500 may include a first angular velocity detection apparatus which outputs a first sensor signal and a second angular velocity detection apparatus which outputs a second sensor signal. In this case, the CPU 520 may perform: a noise amount calculating process of calculating a first noise amount included in the first sensor signal and a second noise amount included in the second sensor signal; and a selecting process of selecting any of the first sensor signal and the second sensor signal in accordance with the calculated first noise amount and the calculated second noise amount. Accordingly, by calculating noise amounts included in the respective sensor signals and selecting an appropriate sensor signal from the first and second sensor signals in accordance with the respective noise amounts, the electronic device 500 capable of operating with high reliability even when the noise amounts of the respective sensor signals vary can be realized. Moreover, for example, the selecting process involves comparing the first noise amount and the second noise amount with each other and selecting a sensor signal corresponding to the smaller noise amount.

Various types of electronic devices are conceivable as the electronic device 500. Examples include a personal computer (for example, a mobile personal computer, a laptop personal computer, and a tablet personal computer), a mobile terminal such as a mobile phone, a digital camera, an inkjet-type discharge apparatus (for example, an inkjet printer), a storage area network device such as a router and a switch, a local area network device, a device for a mobile terminal base station, a television set, a video camera, a video recorder, a car navigation apparatus, a pager, a personal digital assistance (including those equipped with a communication function), an electronic dictionary, a calculator, an electronic game device, a game controller, a word processor, a work station, a videophone, a security television monitor, electronic binoculars, a POS (point of sale) terminal, a medical device (for example, an electronic thermometer, a sphygmomanometer, a blood sugar meter, an electrocardiographic apparatus, an ultrasonograph, and an electronic endoscope), a fishfinder, various measurement devices, meters (for example, meters of a vehicle, an aircraft, or a vessel), a wattmeter, a flight simulator, a head-mounted display, a motion tracer, a motion tracker, a motion controller, and PDR (pedestrian dead-reckoning).

Figure 9:
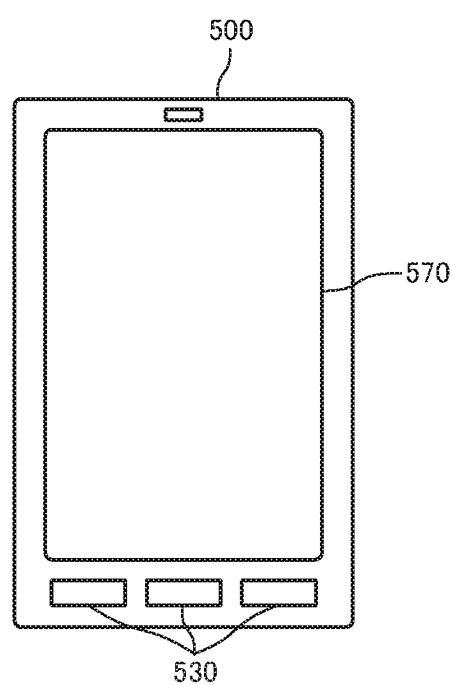
FIG. 9 is a diagram illustrating an example of an appearance of a smart phone that is an example of an electronic device.

FIG. 9 is a diagram illustrating an example of an appearance of a smart phone that is an example of the electronic device 500. The smart phone that is the electronic device 500 includes a button as the operating unit 530 and an LCD as the display unit 570. In addition, with the smart phone that is the electronic device 500, since the diagnostic circuit 72 which enables diagnosis of the connection state of the capacitor C during an operation of a circuit that receives supply of power from the regulator 71 is provided, the electronic device 500 capable of operating in a stable manner can be realized.

3. Mobile Body

Figure 10:
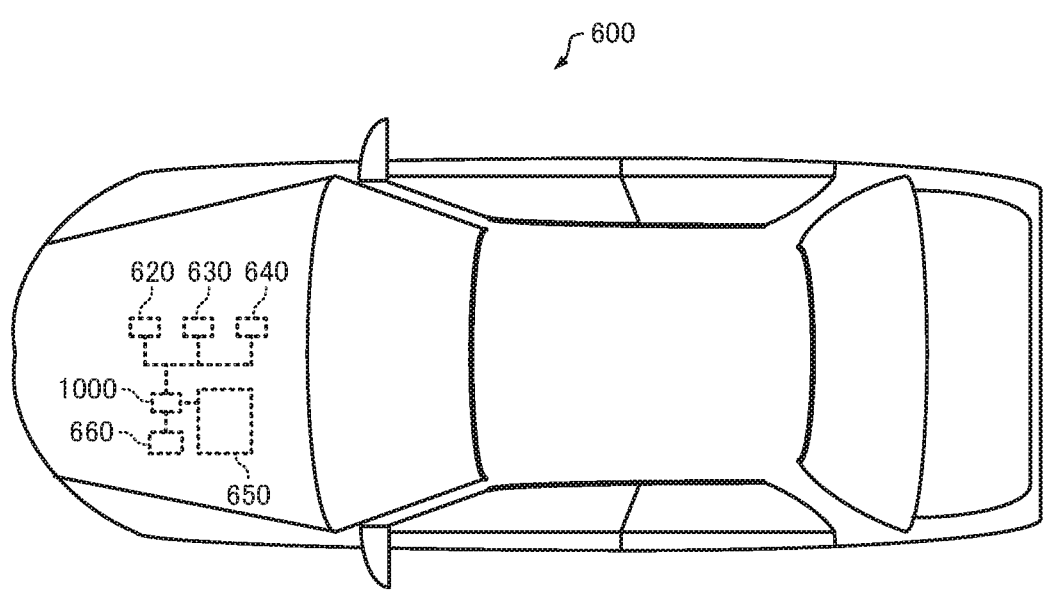
FIG. 10 is a diagram illustrating an example of a mobile body.

FIG. 10 is a diagram (a top view) illustrating an example of a mobile body 600 according to one embodiment of the invention. Moreover, components similar to those of the respective embodiments described above will be denoted by same reference signs and detailed descriptions thereof will be omitted.

The mobile body 600 according to this embodiment includes the physical quantity detection apparatus 1000 provided with the diagnostic circuit 72. In addition, in the example in FIG. 10, the mobile body 600 is configured so as to include a controller 620, a controller 630, and a controller 640 which perform a variety of control of an engine system, a brake system, a keyless entry system, and the like, a battery 650, and a backup battery 660. Moreover, the mobile body 600 may be configured by omitting or changing a part of the components (elements) in FIG. 11 or by adding other components (elements) thereto.

With the mobile body 600, since the diagnostic circuit 72 which enables diagnosis of the connection state of the capacitor C during an operation of a circuit that receives supply of power from the regulator 71 is provided, the mobile body 600 capable of operating in a stable manner can be realized.

Various kinds of mobile bodies are conceivable as the mobile body 600, and examples thereof include an automobile (including electric vehicles), an aircraft such as a jet plane and a helicopter, a vessel, a rocket, and an artificial satellite.

The invention is not limited to the above embodiments and various modifications can be made within the scope of the gist of the invention.

It should be noted that the embodiments and the modifications described above are merely examples and the invention is not limited thereto. For example, the respective embodiments and the respective modifications may be combined as appropriate.

The invention includes configurations which are substantially the same as the configurations described in the embodiments (for example, configurations of which a function, a method, and a result are the same or configurations of which an object and an effect are the same). In addition, the invention includes configurations in which nonessential portions of the configurations described in the embodiments have been replaced. Furthermore, the invention includes configurations which produce the same effects or configurations capable of achieving the same objectives as the configurations described in the embodiments. Moreover, the invention includes configurations in which known art is added to the configurations described in the embodiments.

The invention claimed is:

1. A diagnostic circuit diagnosing connection states of a first capacitor connected to an output terminal of a first regulator and a second capacitor connected to an output terminal of a second regulator, the diagnostic circuit comprising:
   a first switching circuit that switches, during a first period, an output voltage of the first regulator that outputs a first voltage to a second voltage that is higher than the first voltage;
   a first internal capacitor;
   a first current mirror circuit that outputs a mirror current of an output current of the first regulator to one end of the first internal capacitor;
   a second switching circuit that switches, during the first period, an output voltage of the second regulator that outputs a third voltage to a fourth voltage that is higher than the third voltage;
   a second internal capacitor;
   a second current mirror circuit that outputs a mirror current of an output current of the second regulator to one end of the second internal capacitor; and
   a determining circuit that determines connection states of the first capacitor and the second capacitor,
   the determining circuit including:
   a first comparator that compares a voltage at the one end of the first internal capacitor with a first reference voltage;
   a second comparator that compares a voltage at the one end of the second internal capacitor with a second reference voltage; and
   a determining unit that determines the connection states of the first capacitor and the second capacitor based on a time required by the voltage at the one end of the first internal capacitor to exceed the first reference voltage and a time required by the voltage at the one end of the second internal capacitor to exceed the second reference voltage.

2. An electronic circuit comprising:
the diagnostic circuit according to claim 1; and
a reset circuit that changes a potential difference between the first voltage and the second voltage and outputs a reset signal of the electronic circuit when the determining circuit determines that the connection state is anomalous.

3. An electronic circuit comprising:
the diagnostic circuit according to claim 1; and
a register,
the diagnostic circuit writing error information into the register when the determining circuit determines that the connection state of the capacitor is anomalous.

4. An electronic circuit comprising:
the diagnostic circuit according to claim 1,
the determining circuit outputting an error information signal to the outside when determining that the connection state of the capacitor is anomalous.

5. An electronic circuit comprising:
the diagnostic circuit according to claim 1; and
a reset circuit that outputs a reset signal of the electronic circuit when the determining circuit determines that the connection state is anomalous.

6. An electronic device comprising the diagnostic circuit according to claim 1.

7. An electronic device comprising:
the diagnostic circuit according to claim 1;
a sensor that outputs a sensor signal in accordance with a size of a physical quantity; and
a processing circuit,
the processing circuit performing:
a noise amount calculating process of calculating a noise amount included in the sensor signal; and
a determining process of determining that the noise amount is larger than a threshold.

8. An electronic device comprising:
the diagnostic circuit according to claim 1;
a first sensor that outputs a first sensor signal in accordance with a size of a physical quantity;
a second sensor that outputs a second sensor signal in accordance with a size of a physical quantity; and
a processing circuit,
the processing circuit performing:
a noise amount calculating process of calculating a first noise amount included in the first sensor signal and a second noise amount included in the second sensor signal; and
a selecting process of selecting any of the first sensor signal and the second sensor signal in accordance with the first noise amount and the second noise amount.

9. A mobile body comprising the diagnostic circuit according to claim 1.

10. An electronic device comprising:
a diagnostic circuit diagnosing a connection state of a capacitor connected to an output terminal of a regulator that outputs a first voltage;
a sensor that outputs a sensor signal in accordance with a size of a physical quantity; and
a processing circuit,
the diagnostic circuit comprising:
a switching circuit that performs, during a first period, a switching control process of switching an output voltage of the regulator to a second voltage that is higher than the first voltage;
a detecting circuit that detects a variation in an output current of the regulator caused by the switching control process while the output voltage is switched to the second voltage during the first period; and a determining circuit that determines the connection state of the capacitor based on a detection result of the detecting circuit as performed during the first period, the processing circuit performing:

a noise amount calculating process of calculating a noise amount included in the sensor signal; and a determining process of determining that the noise amount is larger than a threshold.

11. An electronic device comprising:

a diagnostic circuit diagnosing a connection state of a capacitor connected to an output terminal of a regulator that outputs a first voltage;

a first sensor that outputs a first sensor signal in accordance with a size of a physical quantity;

a second sensor that outputs a second sensor signal in accordance with a size of a physical quantity; and a processing circuit, the diagnostic circuit comprising:

a switching circuit that performs, during a first period, a switching control process of switching an output voltage of the regulator to a second voltage that is higher than the first voltage;

a detecting circuit that detects a variation in an output current of the regulator caused by the switching control process while the output voltage is switched to the second voltage during the first period; and a determining circuit that determines the connection state of the capacitor based on a detection result of the detecting circuit as performed during the first period, the processing circuit performing:

a noise amount calculating process of calculating a noise amount included in the sensor signal; and a selecting process of selecting any of the first sensor signal and the second sensor signal in accordance with the first noise amount and the second noise amount.

* * * * *

UNITED STATES PATENT AND TRADEMARK OFFICE
CERTIFICATE OF CORRECTION

PATENT NO. : 11,262,416 B2
APPLICATION NO. : 15/776147
DATED : March 1, 2022
INVENTOR(S) : Akio Tsutsumi et al.

Page 1 of 1

It is certified that error appears in the above-identified patent and that said Letters Patent is hereby corrected as shown below:

In the Claims

In Claim 11, at Column 24, Lines 14 and 15, "a noise amount calculating process of calculating a noise amount included in the sensor signal; and" should read:
-- a noise amount calculating process of calculating a first noise amount included in the first sensor signal and a second noise amount included in the second sensor signal; and --.

Signed and Sealed this
Tenth Day of May, 2022

*Katherine Kelly Vidal*

Katherine Kelly Vidal
*Director of the United States Patent and Trademark Office*